United States Patent [19]

Shimoji et al.

[11] 4,187,471
[45] Feb. 5, 1980

[54] BIAS CIRCUIT

[75] Inventors: Yutaka Shimoji, Ebina; Youichi Arai, Machida, both of Japan

[73] Assignee: Fujitsu Limited, Kawasaki, Japan

[21] Appl. No.: 935,646

[22] Filed: Aug. 21, 1978

[30] Foreign Application Priority Data

Sep. 2, 1977 [JP] Japan .................. 52-104722

[51] Int. Cl.² .................. H03F 3/189; H03F 3/68
[52] U.S. Cl. .................. 330/277; 330/56; 330/124 R; 330/286; 330/295; 330/296; 330/297
[58] Field of Search .................. 330/53, 56, 57, 277, 330/286, 287, 295, 297, 296, 124 R; 333/11

[56] References Cited

U.S. PATENT DOCUMENTS

| | | | |
|---|---|---|---|
| 3,189,848 | 6/1965 | Miyagi | 330/124 R X |
| 3,440,570 | 4/1969 | Kasper | 333/11 X |
| 3,789,315 | 1/1974 | Beurrier | 330/53 X |
| 4,107,621 | 8/1978 | Furutani et al. | 330/296 |

Primary Examiner—James B. Mullins
Attorney, Agent, or Firm—Staas & Halsey

[57] ABSTRACT

Disclosed is a bias circuit of an amplifier for a microwave circuit, which amplifier is comprised of a pair of amplifier modules and at least one directional quadrature coupler having four ports including an isolation port, wherein the bias circuit is connected to the isolation port of the directional quadrature coupler.

16 Claims, 9 Drawing Figures

BIAS CIRCUIT

BACKGROUND OF THE INVENTION

1. Field of the Invention

The present invention relates to a bias circuit and more particularly to a dc bias circuit of an amplifier for a microwave circuit.

Generally, various kinds of amplifiers for microwave circuits have been proposed and used. Most of these amplifiers are designed to be used not over a wide bandwidth of the microwave frequency range, but over a relatively narrow bandwidth of the microwave frequency range. However, in recent years, the demand for amplifiers which are suitable to be used over a wide microwave frequency range has increased greatly in, for example, microwave communication systems having multiple communication channels. In such communication systems, it is preferable to employ an amplifier therein which is operable with respect to each of the multiple communication channels. Consequently, it is desirable to provide an amplifier which can be used over a wide microwave frequency range.

2. Description of the Prior Art

The construction of a wide bandwidth amplifier from a pair of amplifier modules and directional quadrature couplers associated in known, as will be explained hereinafter. Specifically, this type of wide bandwidth amplifier of the prior art is comprised of a pair of amplifier modules, a directional quadrature input coupler which is located at the respective inputs of the amplifier modules, a directional quadrature output coupler which is located at the respective outputs of the amplifier modules and a dc bias circuit. The dc bias circuit supplies a dc bias current to the amplifier modules. The directional quadrature input coupler is very useful for obtaining an optimum input impedance for the pair of amplifier modules in the wide bandwidth amplifier. However, this wide bandwidth amplifier requires a very complicated wide bandwidth dc bias circuit. Therefore, this kind of wide bandwidth amplifier is very high in cost. Accordingly, a substantially wide bandwidth dc bias circuit, disclosed hereinafter, which is relatively low in cost, is conventionally utilized as the dc bias circuit. This conventional wide bandwidth dc bias circuit is comprised of four bias chokes located at respective inputs and outputs of the amplifier modules. However, this conventional wide bandwidth dc bias circuit has the following two defects. Firstly, it is considerably difficult to design suitable rf chokes for forming the wide bandwidth amplifier. Secondly, it is impossible to obtain a gain-frequency characteristic which is substantially the same as that obtained by using the previously mentioned very complicated wide bandwidth dc bias circuit.

SUMMARY OF THE INVENTION

Therefore, it is an object of the present invention to provide a dc bias circuit for a wide bandwidth amplifier, which dc bias circuit can overcome the two above-mentioned defects without decreasing the capability of the wide bandwidth dc bias circuit.

Another object of the present invention is to provide a wide bandwidth dc bias circuit which is smaller in size than the conventional wide bandwidth dc bias circuit which comprises four rf chokes, whereas the wide bandwidth dc bias circuit of the present invention is comprised of two bias rf chokes.

BRIEF DESCRIPTION OF THE DRAWINGS

The present invention will become more apparent and its construction better understood from the following detailed description with reference to the accompanying drawings, in which.

DESCRIPTION OF THE PREFERRED EMBODIMENT

Figure 1:
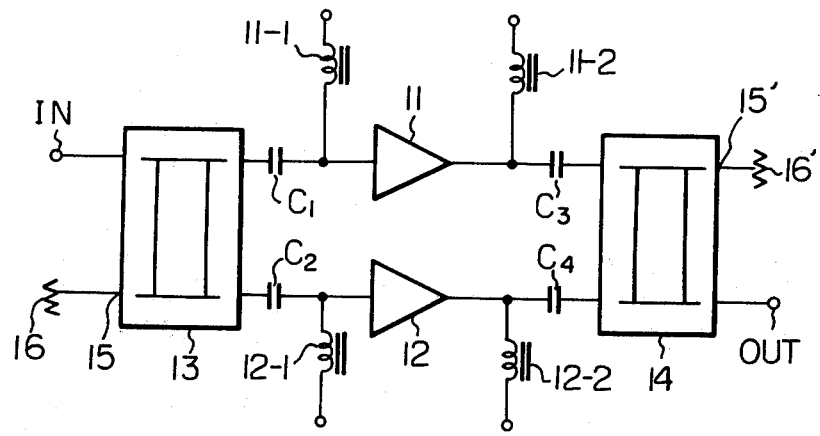
FIG. 1 is a block diagram of an amplifier employing a dc bias circuit according to the prior art.
Figure 6:
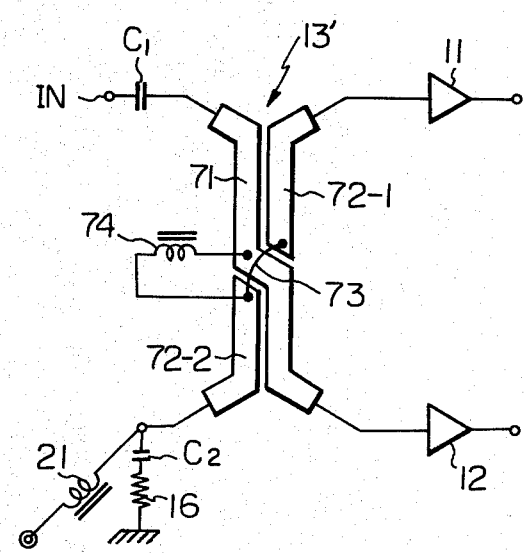
FIG. 6 is a plan view of another type of coupler which may be used as the input coupler 13 shown in FIG. 5.
Figure 8:
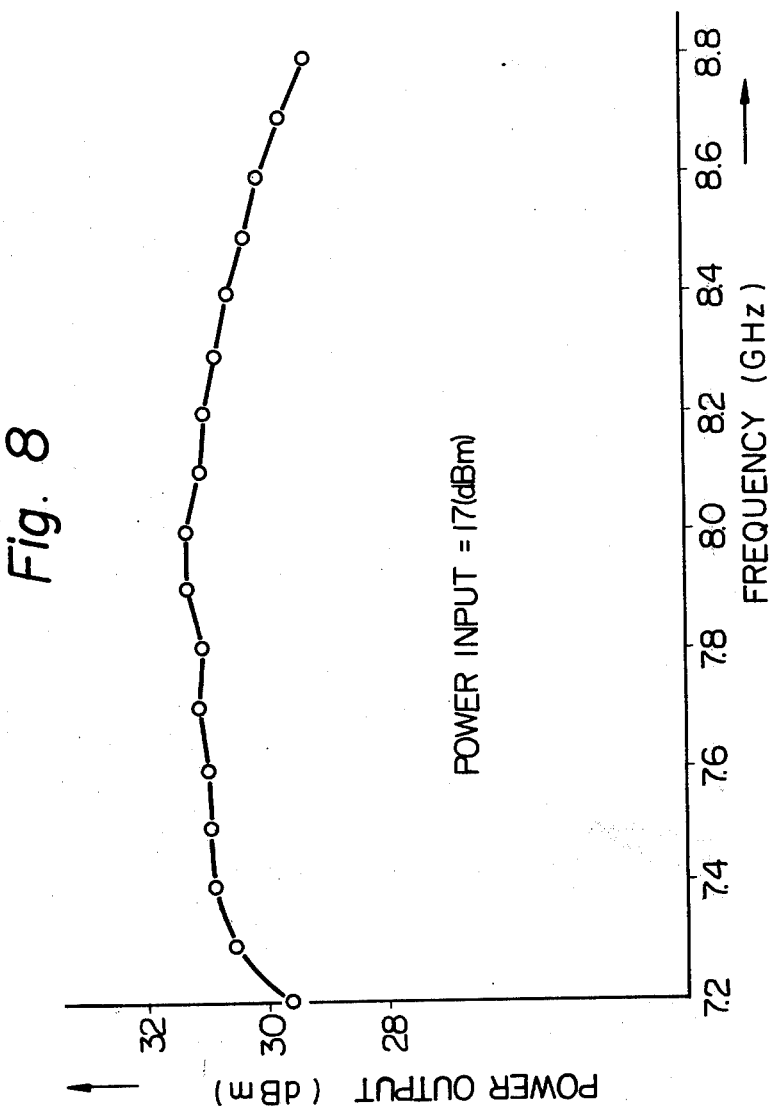
FIG. 8 is a graph indicating the output power-frequency characteristic of the amplifier shown in FIG. 9.

FIG. 1 shows a block diagram of an amplifier employing a dc bias circuit according to the prior art, such as that shown in FIGS. 15 and 16 on page 749 of "RCA Review," Vol 33, December, 1972, and also that shown in FIGS. 6 and 8 on page 77 of "MICROWAVES," October, 1977. Illustrated in FIG. 1 is a complete amplifier for a microwave circuit consisting of a pair of amplifier modules 11 and 12, a dc bias circuit comprising rf chokes 11-1, 11-2, 12-1 and 12-2, a directional quadrature input coupler 13 and a directional quadrature output coupler 14. Furthermore, the numerals 15 and 15' represent isolation ports of the input coupler 13 and the output coupler 14, respectively. The numerals 16 and 16' represent dummy resistors connected to the isolation ports 15 and 15', respectively. The symbols $C_1$, $C_2$, $C_3$ and $C_4$ represent respective dc blocking capacitors. The symbols IN and OUT represent an input terminal and an output terminal of the amplifier, respectively. The input coupler 13 is used to divide power input applied to the input terminal IN located between the two amplifier modules 11 and 12 to reduce the terminal voltage standing wave ratio, that is, the so-called VSWR. The divided power inputs are next amplified by the amplifier modules 11 and 12 and then synthesized by the output coupler 14 to produce an amplifier power output from the output terminal OUT. Generally, it is difficult for a conventional transistor amplifier to get an optimum input impedance and to obtain an optimum value of VSWR, that is, a value of VSWR which is lower than 1.5, over the wide microwave frequency range. The reason for such difficulty is due to the fact that it is impossible to obtain transistor having a useful input impedance over the wide microwave frequency range, and also at a relatively high power output such as 1 watt. Even though a suitable matching circuit is employed at the input of the transistor, it is impossible to perfectly match the low input impedance to the characteristic impedance of transmission line over the wide microwave frequency range. However, as previously mentioned, the amplifier which comprises the pair of amplifier modules 11 and 12 and the directional quadrature input coupler 13, which is usually a 3-db coupler, is useful for maintaining a relatively low VSWR. However, the amplifier modules 11 and 12 should both have the same electric characteristics. When the input impedances of the amplifier modules 11 and 12 are decreased, the power input is reflected at the respective input ports thereof. In this case, since the amplifier modules 11 and 12 have the same electric characteristics, the amplitudes and phases of waves of the reflected power inputs are also the same as each other. Therefore, the reflected power inputs are absorbed by the dummy resistor 16 at the isolation port 15. At the same time, the reflected power inputs are not produced at the input terminal IN. As a result, good VSWR at the input terminal IN can be maintained, that can be, the VSWR is maintained at a value lower than 1.5, over the wide microwave frequency bandwidth.

In contrast to the above, in view of the dc bias circuit consisting of four rf chokes 11-1, 11-2, 12-1 and 12-2, it is not easy for the dc bias circuit, especially the input rf chokes 11-1 and 12-1, to maintain an optimum VSWR over the wide microwave frequency bandwidth. This is because the variation of the impedance values of the rf chokes 11-1 and 12-1 influences the output power versus frequency characteristic, which variation may be induced due to the variation of the microwave frequency. Accordingly, the impedance values of the rf chokes 11-1 and 12-1 should be constant and high irrespective of the variation of the microwave frequency. However, in wide bandwidth amplifiers, the above-mentioned variation of the impedance value of the rf chokes 11-1 and 12-1 is unavoidable. As a result, the variation of the rf chokes promotes improper performance of the amplifier, such as an inferior output power versus frequency characteristic, gain and so on, over the wide microwave frequency bandwidth.

Figure 2:
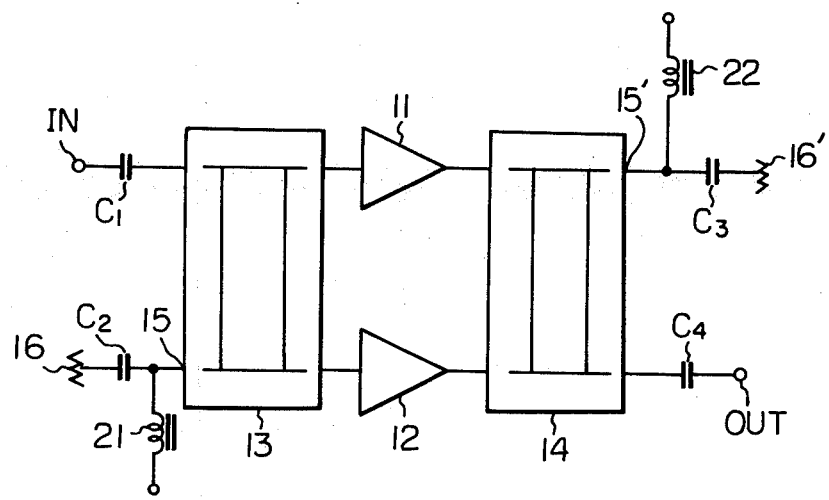
FIG. 2 is a block diagram of an amplifier employing a dc bias circuit according to the present invention.

FIG. 2 is a block diagram of an amplifier employing a dc bias circuit according to the present invention. The members shown in FIG. 2 and the members shown in FIG. 1 which are designated by the same numerals and symbols are identically the same. The dc bias circuit of the present invention consists of an rf choke 21 and an rf choke 22. However, it should be noted the rf choke 22 and also the dc blocking capacitors $C_3$ and $C_4$ shown in FIG. 2 may be replaced by the conventional rf chokes 11-2, 12-2 and also by the dc blocking capacitors $C_3$ and $C_4$ shown in FIG. 1, if necessary. As seen in FIG. 2, a single rf choke 21 is connected with the isolation port 15 of the input coupler 13, and a single rf choke 22 is connected with the isolation port 15' of the output coupler 14. These rf chokes 21 and 22 are connected to respective sources of direct current (not shown), according to the present invention. Regarding the rf choke 21, bias dc currents of the input side are supplied to both amplifier modules 11 and 12 from the direct current source via strip lines of the input coupler 13. This bias choke 21 can be used to maintain a VSWR level which is substantially the same as the VSWR level obtained by using the conventional rf chokes 11-1 and 11-2 shown in FIG. 1, although the design practice of the rf choke 21 can be more easily carried out than the design practice of the conventional rf chokes 11-1, 11-2 shown in FIG. 1. Briefly, the reason why the design practice of the rf choke 21 can be easily carried out is because the rf choke 21 is located at the isolation port 15 of the input coupler 13. Due to this location, the variation of the impedance value of rf choke 21 due to the variation of the microwave frequency does not directly affect the VSWR at the input terminal IN and the output impedance of the input coupler 13. Thus, the impedance value of this rf choke 21 is allowed to vary relatively over a wide range of microwave frequencies, while the impedance values of the conventional rf chokes 11-1 and 11-2 shown in FIG. 1 are not allowed to vary relatively over the wide range of microwave frequencies.

Figure 3:
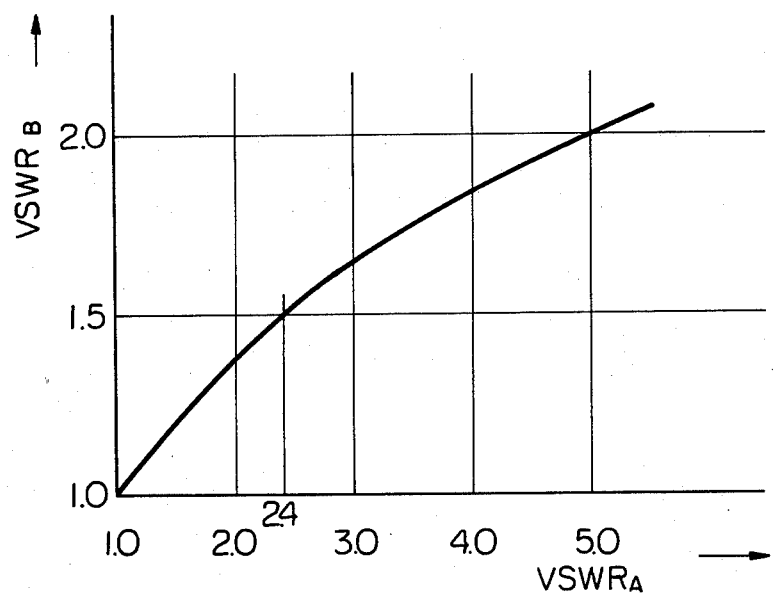
FIG. 3 shows a curve used for explaining an improvement of the VSWR (Voltage Standing Wave Ratio) level in accordance with the present invention.

The above-mentioned improvement of the VSWR according to the present invention will be further clarified by referring to FIG. 3. FIG. 3 shows a curve of relative values of the VSWR level which is viewed from the arrow (A) shown in FIG. 4 and of the VSWR level which is viewed from the arrow (B) shown in FIG. 4.

Figure 4:
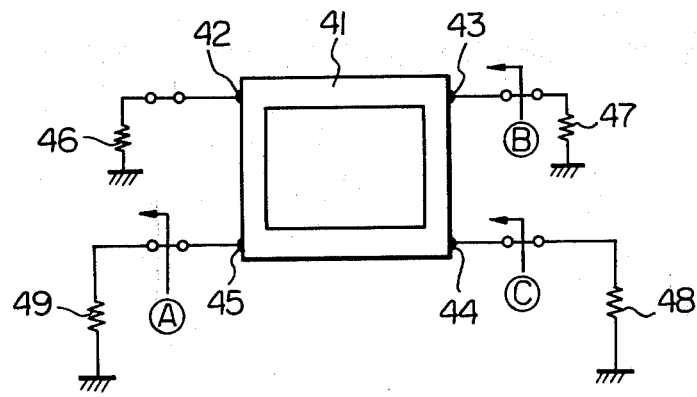
FIG. 4 is a circuit diagram of a testing circuit including the directional quadrature input coupler 13 shown in FIG. 2 for obtaining the curve shown in FIG. 3.

FIG. 4 is a circuit diagram of a testing circuit which includes the directional quadrature coupler shown in FIG. 2, used for obtaining the curve shown in FIG. 3. In FIG. 4, a directional quadrature coupler 41 corresponds to the input coupler 13 shown in FIG. 2. An input port 42 of the coupler 41 has a resistor 46 having a resistance value of 50Ω. The first and second output ports 43, 44 have resistors 47, 48 each with a resistance value of 50Ω. An isolation port 45 of the coupler 41 has a resistor 49 with a resistance value of RΩ. The value of R is variable in order to obtain the curve shown in FIG. 3. The relative values of the VSWR level which is viewed from the arrow (A) are indicated on the abscissa of the curve shown in FIG. 3 as $VSWR_A$, while the relative values of the VSWR level which is viewed from the arrow (B) are indicated on the ordinate of the curve as $VSWR_B$. It should be noted that the relative values of the VSWR level which is viewed from the arrow (C) are exactly the same as those of the VSWR level which is viewed from the arrow (B) at the center of the bandwidth of the frequency range, but the VSWR level which is viewed from the arrow (C) is slightly different from the VSWR level which is viewed from the arrow (B) in the microwave frequency band except the center frequency.

By referring to the curve shown in FIG. 3, the improvement of the VSWR according to the present invention can be further understood. When the value of $VSWR_B$, which is a value of the VSWR level viewed from the arrow (B), is selected to equal, for example, 1.5, the value of $VSWR_A$, which is a value of the VSWR level viewed from the arrow (A), will then correspond to the value of 2.4. Thus, when the $VSWR_B$ is equal to 1.5, then $VSWR_A$ will be 2.4. Therefore, the value of the $VSWR_A$ can be selected from a value which is considered poor if compared to the value of the $VSWR_B$. In other words, there is a relatively wide range of values from which the resistance value of the resistor 49 can be selected. Similarly, for example, when the $VSWR_B$ is equal to 2.0, then the $VSWR_A$ will be 5.0, since there is a relatively wide range of values from which the resistance value of the resistor 49 can be selected. Thus, it can be concluded that, when a microwave engineer is designing a wide bandwidth amplifier, he can roughly construct the rf choke 21 (shown in FIG. 2), while he must strictly construct the conventional rf chokes 11-1 an 12-1 (shown in FIG. 1).

The above-mentioned explanation pertaining to the improvement of the VSWR according to the present invention was given only with regard to the directional quadrature input coupler 13 shown in FIG. 2. However, it should be noted that an explanation similar to the above-mentioned explanation can also be provided with regard to the directional quadrature output coupler 14 shown in FIG. 2.

Figure 5:
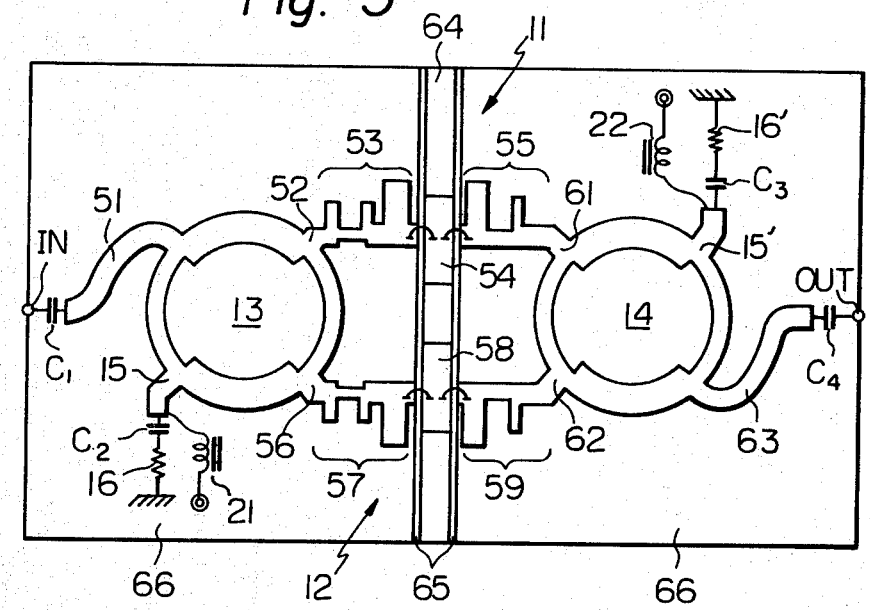
FIG. 5 is a plan view of the actual amplifier shown in FIG. 2, which is formed into used in a microwave integrated circuit amplifier, according to the present invention.

FIG. 5 is plan view of the actual amplifier shown in FIG. 2 which is utilized as a microwave integrated circuit amplifier, according to the present invention. The circuit members shown in FIG. 5 and those shown in FIG. 2 which are designated by the same numerals and symbols are identically the same. Both the directional quadrature input coupler 13 and the directional quadrature output coupler 14 may be constructed by using either a conventional ring type coupler or a conventional distributed coupling type coupler, both types of couplers being made of strip lines. However, only conventional ring type couplers 13 and 14 are shown in FIG. 5. The input port of the input coupler 13 is connected to the input terminal IN via a strip lead 51 and dc blocking capacitor $C_1$. The first output port 52 is connected to the amplifier module 11, comprising an FET (Field Effect Transistor) 54 and conventional input and output matching circuits 53 and 55. The input and output matching circuits 53 and 55 are also made of strip lines having the so-called open stubs and transmission lines. A second output port 56 is connected to the amplifier module 12 comprising an FET 58 and conventional input and output matching circuits 57 and 59. The input and output matching circuits 57 and 59 are also made of strip lines having the so-called open stubs and transmission lines. A first input port 61 of the output coupler 14 is connected to the output matching circuit 55. A second input port 62 of the output coupler 14 is connected to the output matching circuit 59. The output port of the output coupler 14 is connected to the output terminal OUT via a strip line lead 63 and the dc blocking capacitor $C_4$.

The gate bias currents to be supplied to both gate electrodes (not shown) of FET 54 and FET 58 are supplied, via a strip line of the input coupler 13, from the bias circuit according to the present invention. This bias circuit is connected to the isolation port 15. This bias circuit is comprised of the dc blocking capacitor $C_2$ having a capacitance value of, for example 39 pF, the dummy resistor 16 having a resistance value of, for example, 50Ω, and the bias choke 21. The rf choke 21 is connected to a direct current source (not shown). On the other hand, the drain bias currents to be supplied to both of the drain electrodes (not shown) of the FETS 54 and 58 are supplied via the strip line of the output coupler 14 from the bias circuit according to the present invention, which bias circuit being connected to the isolation port 15'. This bias circuit is comprised of the dc blocking capacitor $C_3$ having a capacitance value of, for example, 39 pF, a dummy resistor 16' having a resistance value of, for example, 50Ω, and the rf choke 22. The rf choke 22 is connected to a direct current source (not shown). The source electrodes (not shown) of FET 54 and FET 58 are grounded. FET 54 and FET 58 are directly mounted on a pedestal 64 which is projected from a ground plate 65. The pedestal 64 and the ground plate 65 are made of, for example, copper. The circuit elements other than the FET 54 and FET 58 are mounted on a thin substrate made of a dielectric material 66 such as $Al_2O_3$, and the thin substrate is coated on the ground plate 65.

The input and output couplers 13 and 14 may also be constructed by utilizing the conventional distributed coupling type coupler, as mentioned hereinbefore. Accordingly, each of the couplers 13 and 14 shown in FIG. 5 can be replaced by the conventional distributed coupling type coupler, the plan view of which is shown in FIG. 6. In FIG. 6, a distributed coupling type input coupler 13' is revealed. The circuit elements shown in FIG. 6 and those shown in FIG. 5 which are designated by the same numerals and symbols are identically the same. Strip lines 71, 72-1 and 72-2 together form a distributed coupling of a power input. The strip lines 72-1 and 72-2 are electrically connected by a simple bonding wire 73, in accordance with the conventional method. The gate bias current is supplied to the FET of the amplifier module 11 from a direct current source (not shown) via the rf choke 21, the strip line 72-2, the bonding wire 73 and the strip line 72-1. An additional rf choke 74 is newly employed in the coupler 13' for the purpose of supplying the gate bias current to the FET of the amplifier module 12. This gate bias current flows through the rf choke 21, the strip line 72-2, the additional rf choke 74 and the strip line 71. It should be noted that the distributed coupling type of the coupler shown in FIG. 6 can also be applied to the output coupler 14 shown in FIG. 5.

The bias circuit, shown in FIGS. 5 and 6, comprising a series connection between both the dc blocking capacitor $C_2$ and the dummy resistor 16, and the rf choke 21 connected parallel with the series connection, is useful for an amplifier which requires a gate bias current with a high amplitude. However, if the gate bias current is a low amplitude current, it is preferable to employ the bias circuit shown in FIG. 7. This bias circuit is comprised of a series connection between both the dummy resistor 16 and the dc blocking capacitor $C_2$ and an rf choke 21' which is connected at one end thereof to a connecting point between the resistor 16 and the capacitor $C_2$. In this case, a series connection between the resistor 16 and the rf choke 21' is connected to a direct current source (not shown). Since the gate bias current has a low amplitude, the voltage drop across the resistor 16 is very small. The advantage of this bias circuit resides in that the reactance value of the rf choke 21' can be selected to be a small value as compared to that of the rf choke 21 shown in FIGS. 5 and 6.

Figure 7:
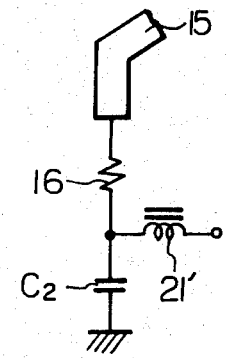
FIG. 7 is a circuit diagram showing another construction of the bias circuit shown in FIGS. 5 and 6.

The bias circuit shown in FIG. 7 is preferably applied only to the gate bias circuit. Applying this bias circuit to the drain bias circuit shown in FIG. 5, which drain bias circuit comprises the rf choke 22, the dc blocking capacitor $C_3$ and the dummy resistor 16', is not preferred because the drain bias current is usually a very high amplitude current. If the drain bias circuit was constructed as shown in FIG. 7, the voltage drop across the resistor 16 would be very large.

Figure 9:
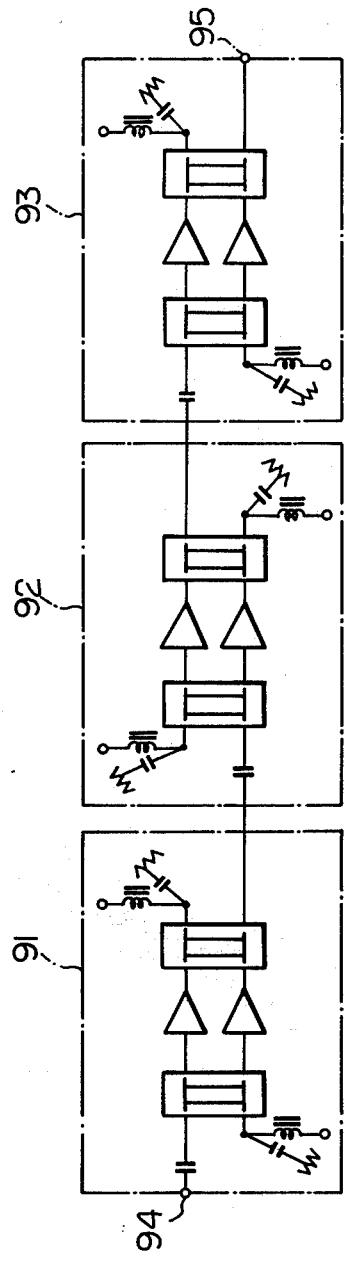
FIG. 9 is a block diagram of a practical amplifier used for obtaining the graph shown in FIG. 8; which practical amplifier consists of three amplifier stages, each of which corresponds to a block diagram which is the same as that shown in FIG. 2 according to the present invention.

FIG. 8 is a graph indicating the power output-frequency characteristics of the widely practical amplifier shown in FIG. 9. This widely practical amplifier consists of three amplifier stages arranged in cascade, each of which amplifier stages has the same block diagram as that shown in FIG. 2 of the present invention. In FIG.

9, the widely practical amplifier 90 is comprised of first, second and third amplifier stages 91, 92 and 93. The numerals 94 and 95 represent an input terminal and an output terminal of the amplifier 90, respectively. In FIG. 8, the abscissa of the graph indicates the frequency in GHz, while the ordinate of the graph indicates the level of the power output produced from the output terminal 95 in FIG. 9. In this case, the level of input power applied to the input terminal 94 in FIG. 9 is set to be 17 dBm. As can be seen from FIG. 8, the power output-frequency characteristics are comparable with the known power output-frequency characteristics obtained from a conventional amplifier having three amplifier stages, although the number of the rf chokes corresponding to the rf chokes 21 and 22 shown in FIG. 2 is reduced by one-half of the number of the conventional rf chokes corresponding to the rf chokes 11-1, 11-2, 11-3 and 11-4 shown in FIG. 1. Accordingly, the microwave engineer can more readily construct the rf chokes of the present invention as compared to the construction of the conventional rf chokes.

As mentioned above, utilization of the bias current according to the present invention can decrease the size of the wide bandwidth amplifier, reduce the cost of the wide bandwidth amplifier due to the reduction of the number of rf chokes therein and simplify the construction of the wide bandwidth amplifier.

What is claimed is:

1. An amplifier circuit, having a bias circuit, comprising a pair of amplifier modules each of said pair of amplifier modules having an input and an output and at least one directional quadrature coupler operatively connected to said pair of amplifier modules, said at least one directional quadrature coupler having four ports including an isolation port, wherein said bias circuit is directly connected to said isolation port of said at least one directional quadrature coupler and wherein a dc bias current is supplied from said isolation port to said pair of amplifier modules through said at least one directional quadrature coupler.

2. An amplifier circuit as set forth in claim 1, wherein said amplifier circuit comprises: two directional quadrature couplers including a directional quadrature input coupler and a directional quadrature output coupler; said directional quadrature input coupler having a first output port operatively connected to the input of a first of said pair of amplifier modules, having a second output port operatively connected to the input of a second of said pair of amplifier modules, and having an input port and an isolation port; said directional quadrature output coupler having a first input port operatively connected to the output of a first of said pair of amplifier modules, having a second input port operatively connected to the output of a second of said pair of amplifier modules, and having an output port and an isolation port, said bias circuit directly connected to said isolation port of said directional quadrature input coupler.

3. An amplifier circuit as set forth in claim 2, wherein at least one of said directional quadrature input and output couplers is made of a ring type coupler.

4. An amplifier circuit as set forth in claim 2, wherein at least one of said directional quadrature input and output couplers is made of a distributed coupling type coupler consisting of a first strip line and a second strip line, both said first and second strip lines intersect with each other via a crossover there between, and a choke element is connected therebetween.

5. An amplifier circuit as set forth in claim 2, wherein a dc blocking capacitor is inserted at the input port of said directional quadrature input coupler.

6. An amplifier circuit as set forth in claim 1, wherein said amplifier circuit comprises: two directional quadrature couplers including a directional quadrature input coupler and a directional quadrature output coupler; said directional quadrature input coupler having a first output port operatively connected to the input of a first of said pair of amplifier modules, having a second output port operatively connected to the input of a second of said pair of amplifier modules, having an input port and an isolation port; said directional quadrature output coupler having a first input port operatively connected to the output of said amplifier modules and further having an output port and an isolation port, said bias circuit directly connected to said isolation port of said directional quadrature output coupler.

7. An amplifier circuit as set forth in claim 6, wherein at least one of said directional quadrature input and output couplers is made of a ring type coupler.

8. An amplifier circuit as set forth in claim 6, wherein at least one of said directional quadrature input and output couplers is made of a distributed coupling type coupler consisting of a first strip line and a second strip line, both said first and second strip lines intersect with each other via a crossover therebetween, and a choke element is connected therebetween.

9. An amplifier circuit as set forth in claim 3, 7, 4 or 8, wherein said bias circuit comprises an rf choke having a first end connected to said isolation port and a second end connected to means for connection to a direct current source, and a series combination of a dummy resistor and a dc blocking capacitor, one end of said series connected combination being electrically connected to said isolation port and the other end thereof being gounded.

10. An amplifier circuit as set forth in claim 3, 7, 4 or 8, wherein said bias circuit comprises a dummy resistor having one end connected to said isolation port and the other end thereof connected to an intermediate connection point, a d c blocking capacitor having one end connected to said intermediate connection point and the other end thereof grounded, and an rf choke having one end connected to said intermediate connection point and the other end connected to means for connection to a direct current source.

11. An amplifier circuit as set forth in claim 6, wherein a dc blocking capacitor is inserted at the output port of said directional quadrature output coupler.

12. An amplifier circuit comprising:
a pair of amplifier modules, each of said pair of amplifier modules having an input and an output, having the same electric characteristics;
a directional quadrature input coupler having an input port, an isolation port, a first output port operatively connected to the input of a first of said pair of amplifier modules, and a second output port operatively connected to the input of a second of said pair of amplifier modules;
a first bias circuit directly connected to said isolation port of said directional quadrature input coupler;
a directional quadrature output coupler having an output port, an isolation port, a first input port operatively connected to the output of said first of said pair of amplifier modules, and a second input port operatively connected to the output of said second of said pair of amplifier modules;

a second bias circuit directly connected to said isolation port of said directional quadrature output coupler.

13. An amplifier circuit as set forth in claim 12, wherein each of said directional quadrature input and ouput couplers is a ring type coupler.

14. An amplifier circuit as set forth in claim 12, wherein each of said directional quadrature input and output couplers is a distributed coupling type coupler consisting of a first strip line and a second strip line, said first and second strip lines intersecting with each other via a cross-over between said first and second strip lines, and wherein a choke element is connected to said first and second strip lines at said cross-over.

15. An amplifier circuit as set forth in claim 13 or 14, wherein said first bias circuit comprises a first rf choke having a first end directly connected to said isolation port of said directional quadrature input coupler and a second end connected to means for connection to a first direct current source, and a series combination of a first dummy resistor and a first dc blocking capacitor, one end of said series connected combination being electrically connected to said isolation port of said directional quadrature input coupler and the other end of said series connected combination being grounded, and wherein said second bias circuit comprises a second rf choke having a first end connected to said isolation port of said directional quadrature output coupler and a second end connected to means for connection to a second direct current source, and a series combination of a second dummy resistor and a second dc blocking capacitor, one end of said series connected combination being electrically connected to said isolation port of said directional quadrature output coupler and the other end of said series connected combination being grounded.

16. An amplifier circuit as set forth in claim 15, wherein said first of said pair of amplifier modules comprises:
a first input matching circuit operatively connected to said first output port of said directional quadrature input coupler;
a first FET operatively connected to said first input matching circuit;
a first output matching circuit operatively connected between said first FET and said first input port of said directional quadrature output coupler; and wherein
said second of said pair of amplifier modules comprises:
a second input matching circuit operatively connected to said second output port of said directional quadrature input coupler;
a second FET operatively connected to said second input matching circuit;
a second output matching circuit operatively connected between said second FET and said second input port of said directional quadrature output coupler.

* * * * *

UNITED STATES PATENT AND TRADEMARK OFFICE
CERTIFICATE OF CORRECTION

PATENT NO. : 4,187,471
DATED : February 5, 1980
INVENTOR(S) : YUTAKA SHIMOJI et al It is certified that error appears in the above—identified patent and that said Letters Patent is hereby corrected as shown below:

Column 5, line 20, delete "identifically", insert --identically--.

Column 2, line 20, delete "formed into".

Column 1, line 28, delete "in", insert --is--.

Signed and Sealed this

Tenth Day of June 1980

[SEAL]

Attest:

SIDNEY A. DIAMOND

Attesting Officer

Commissioner of Patents and Trademarks

UNITED STATES PATENT AND TRADEMARK OFFICE
CERTIFICATE OF CORRECTION

PATENT NO. : 4,187,471
DATED : February 5, 1980
INVENTOR(S) : Yutaka Shimoji et al.

It is certified that error appears in the above—identified patent and that said Letters Patent is hereby corrected as shown below:

The attached sheet of drawing should be inserted respectively as part of the above-identified patent.

Signed and Sealed this

Twelfth Day of August 1980

[SEAL]

Attest:

SIDNEY A. DIAMOND

Attesting Officer

Commissioner of Patents and Trademarks